(12) United States Patent
Szu et al.

(10) Patent No.: US 7,771,219 B1
(45) Date of Patent: Aug. 10, 2010

(54) IC SOCKET WITH OFFSET CAM CAPABLE OF PREVENTING WARPAGE OF COVER

(75) Inventors: Ming-Lun Szu, Tu-cheng (TW); Chih-Pi Cheng, Tu-cheng (TW); Cheng-Ching Chien, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/383,384

(22) Filed: Mar. 24, 2009

(30) Foreign Application Priority Data

Jan. 20, 2009 (TW) .............................. 98200994 U

(51) Int. Cl.
H01R 13/15 (2006.01)
(52) U.S. Cl. ...................................... 439/259
(58) Field of Classification Search ................ 439/259, 439/342
See application file for complete search history.

(56) References Cited

U.S. PATENT DOCUMENTS

| | | | |
|---|---|---|---|
| 5,100,332 A * | 3/1992 | Egawa .......................... 439/72 |
| 6,071,140 A * | 6/2000 | McHugh et al. .............. 439/342 |
| 6,231,366 B1 * | 5/2001 | Pei et al. ..................... 439/342 |
| 6,296,507 B1 * | 10/2001 | Huang ......................... 439/342 |
| 6,338,640 B1 * | 1/2002 | Lin ............................. 439/342 |
| 6,450,825 B1 * | 9/2002 | Huang ......................... 439/342 |
| 6,450,827 B1 * | 9/2002 | Huang et al. ................. 439/342 |
| 6,609,926 B1 * | 8/2003 | Chen et al. .................. 439/342 |
| 6,669,500 B1 * | 12/2003 | Ju .............................. 439/342 |
| 6,716,049 B1 * | 4/2004 | Gattuso et al. .............. 439/331 |
| 6,846,190 B2 * | 1/2005 | Abe et al. .................... 439/135 |
| 6,960,095 B2 * | 11/2005 | Hirata et al. ................. 439/342 |
| 7,023,685 B2 * | 4/2006 | Fujiyama et al. ........... 361/306.1 |
| 7,052,302 B2 * | 5/2006 | Lei et al. ..................... 439/342 |
| 7,056,140 B1 * | 6/2006 | Jiang .......................... 439/342 |
| 7,070,437 B1 * | 7/2006 | Huang ......................... 439/342 |
| 7,114,978 B2 * | 10/2006 | He et al. ..................... 439/342 |
| 7,261,571 B2 * | 8/2007 | Chen et al. ................... 439/68 |
| 7,371,101 B2 * | 5/2008 | He et al. ..................... 439/342 |
| 7,473,122 B2 * | 1/2009 | Zhou et al. .................. 439/342 |
| 7,563,120 B1 * | 7/2009 | Jin ............................. 439/342 |
| 7,588,453 B2 * | 9/2009 | Ma ............................. 439/342 |
| 7,604,495 B2 * | 10/2009 | Ma ............................. 439/342 |
| 7,607,932 B1 * | 10/2009 | Polnyl ......................... 439/342 |
| 2005/0186809 A1 * | 8/2005 | Lei et al. ..................... 439/68 |
| 2005/0215094 A1 * | 9/2005 | He et al. ..................... 439/110 |
| 2008/0108239 A1 * | 5/2008 | Ma ............................. 439/259 |
| 2008/0280473 A1 * | 11/2008 | Zhou et al. .................. 439/259 |

* cited by examiner

*Primary Examiner*—T C Patel
*Assistant Examiner*—Vladimir Imas
(74) *Attorney, Agent, or Firm*—Andrew C. Cheng; Wei Te Chung; Ming Chieh Chang

(57) ABSTRACT

An IC socket (1) for receiving an IC package having a plurality of pins extending downwardly includes a base (2), a plurality of terminals (7) received in the base, a cover (5) mounted upon the base (2), and a cam (6). The cover (5) includes a carrying section (50) for carrying the IC package and a cam-receiving section (51). The carrying section (50) forms a plurality of through holes (500) for insertion of the pins of the IC package. The cam (6) is disposed at the cam-receiving section (51) for actuating the cover (5) to move with respect to the base (2) in a first direction A. The cam (6) is offset from a central line CL of the carrying section (50) which extends along the first direction A.

4 Claims, 5 Drawing Sheets

IC SOCKET WITH OFFSET CAM CAPABLE OF PREVENTING WARPAGE OF COVER

1. FIELD OF THE INVENTION

The present invention relates to an IC socket, and more particularly to a ZIF (Zero Insertion Force) IC socket for receiving an IC package having a plurality of pins extending downwardly.

2. DESCRIPTION OF PRIOR ART

IC sockets are widely used in the electronic transmitting field to interconnect two separate electronic components, i.e. an IC package and a motherboard, so as to establish electrical connection therebetween. One type of the IC sockets is designed to receive an IC package for zero insertion force, which generally includes a base having an array of receiving holes for receiving a plurality of terminals, a cover mounted upon the base for carrying the IC package, and a cam mechanism provided for actuating the cover to slide with respect to the base so as to establish physical and electrical connection between the terminals of the connector and the pins of the IC package.

U.S. Patent application Pub. No. 20080268664 filed by Zhan-Jun Xu etc. discloses a conventional ZIF IC socket including a base having a number of receiving holes, a number of terminals received in the receiving holes respectively, a cover mounted upon the base and capable of sliding with respect to the base, and a driving member disposed between the base and the cover. The cover has a plurality of through holes corresponding to the receiving holes of the base to allow the pins of the IC package to insert into the through holes and then make contact with the terminals retained in the receiving holes.

The driving member is a cam structure and is located at a head section of the cover. A pushing force is provided by the cam as it rotates to urge the cover to move. Simultaneously, another friction force is produced between the cam and the cover in a direction vertical to the direction along which the cover moves. This friction force may raise a torque which is likely to cause warpage of the cover and is thereby harmful for connection between the IC package and the IC socket.

Thus, there is a need to provide a new IC socket that overcomes the above-mentioned problems.

SUMMARY OF THE INVENTION

It is therefore the object of the present invention to provide an IC socket having an improved cam mechanism and being thereby prevented from warpage.

In accordance with the present invention, an IC socket for receiving an IC package having a plurality of pins extending downwardly includes a base, a plurality of terminals received in the base, a cover mounted upon the base, and a cam. The cover includes a carrying section for carrying the IC package and a cam-receiving section. The carrying section forms a plurality of through holes for insertion of the pins of the IC package. The cam is disposed at the cam-receiving section for actuating the cover to move with respect to the base in a first direction. The cam is offset from a central line of the carrying section which extends along the first direction.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
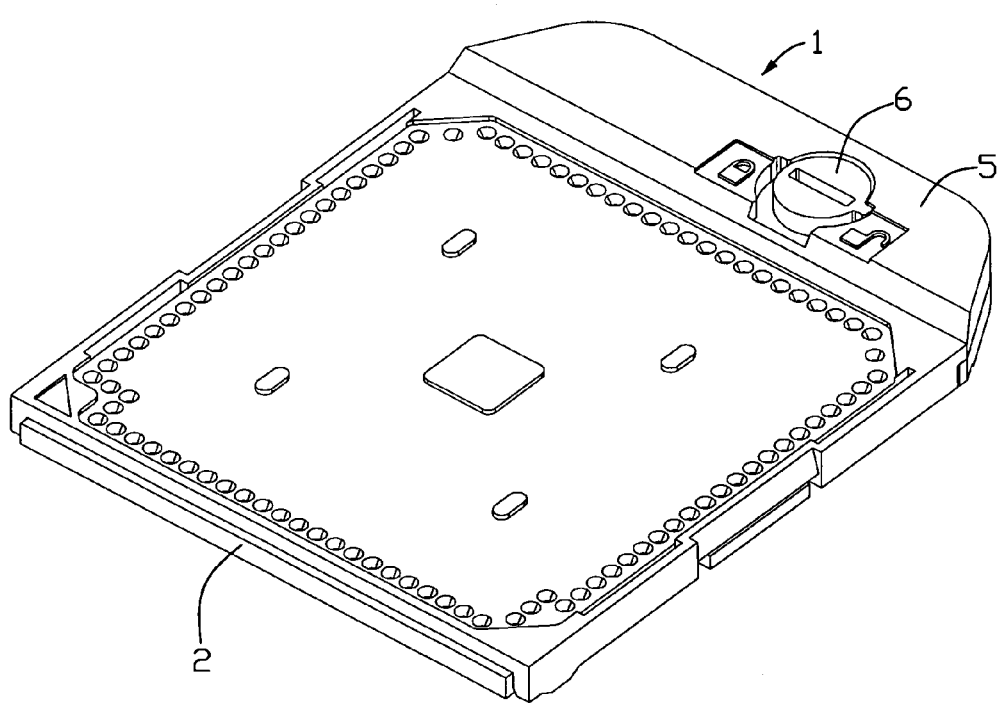
FIG. 1 is an assembled, perspective view of an IC socket in accordance with a preferred embodiment of the present invention.
Figure 2:
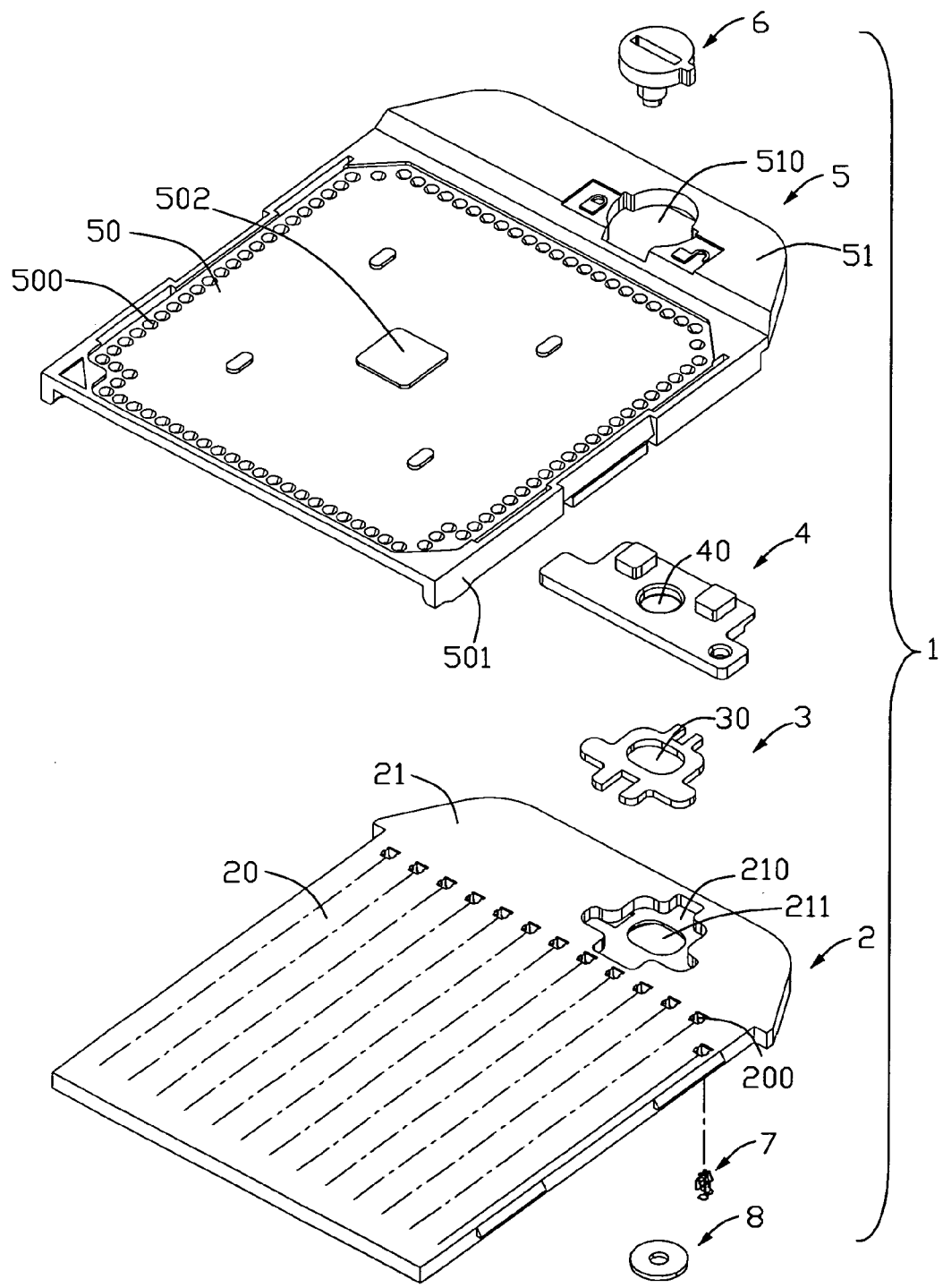
FIG. 2 is an exploded, perspective view of the IC socket shown in FIG. 1.
Figure 3:
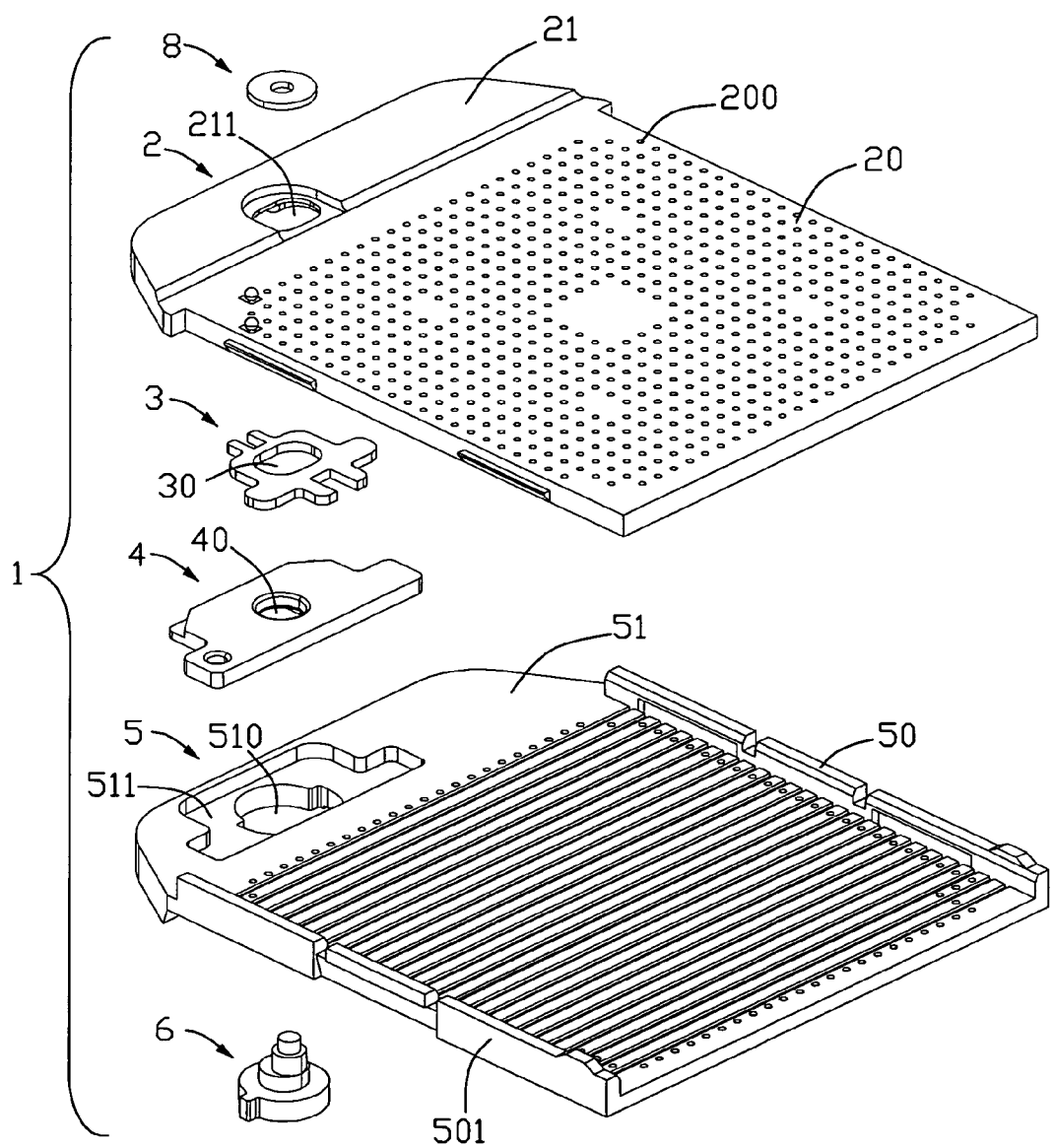
FIG. 3 is an exploded, perspective view of the IC socket shown in FIG. 1, taken from another view.

Referring to FIGS. 1-3, an IC socket 1 in accordance with a preferred embodiment of the present invention is used for receiving an IC package (not shown) having a plurality of pins extending downwardly. The IC socket 1 includes a base 2, a plurality of terminals 7 received in the base 2, a cover 5 mounted upon the base 2, and a cam 6 disposed between the cover 5 and the base 2 for actuating the cover 5 to move with respect to the base 2.

The base 2 includes a cam-positioning section 21 and a terminal-receiving section 20 forming a plurality of receiving holes 200 for mounting the terminals 7. The cover 5 has a shape similar to that of the base 2 and includes a carrying section 50 for carrying the IC package and a cam-receiving section 51. The carrying section 50 forms a plurality of through holes 500 for insertion of the pins of the IC package. The cam-receiving section 51 has a first recess 511 at one surface thereof close to the base 2. An accommodating hole 510 is formed in the recess 511 and extends through the cover 5 in an upright direction. The cam-positioning section 21 has a second recess 210 at one surface thereof close to the cover 5 and an ellipse opening 211 is formed in the second recess 210 to extend through the base 2 in the upright direction. The cover 5 further includes a pair of side walls 501 extending downwardly at two lateral edges (not labeled) thereof to clip corresponding edges (not labeled) of the base 2 and thereby provides guiding to the movement of the cover 5. The carrying section 50 has a smooth surface 502 that located at the center of the carrying portion 50. The smooth surface is not configured with through holes 500.

The first recess 511 of the cover 5 receives a strengthening member 4 formed with a driving hole 40. Similarly, the second recess 210 of the base 2 receives a stiffener 3 formed with an ellipse positioning hole 30.

Figure 4:
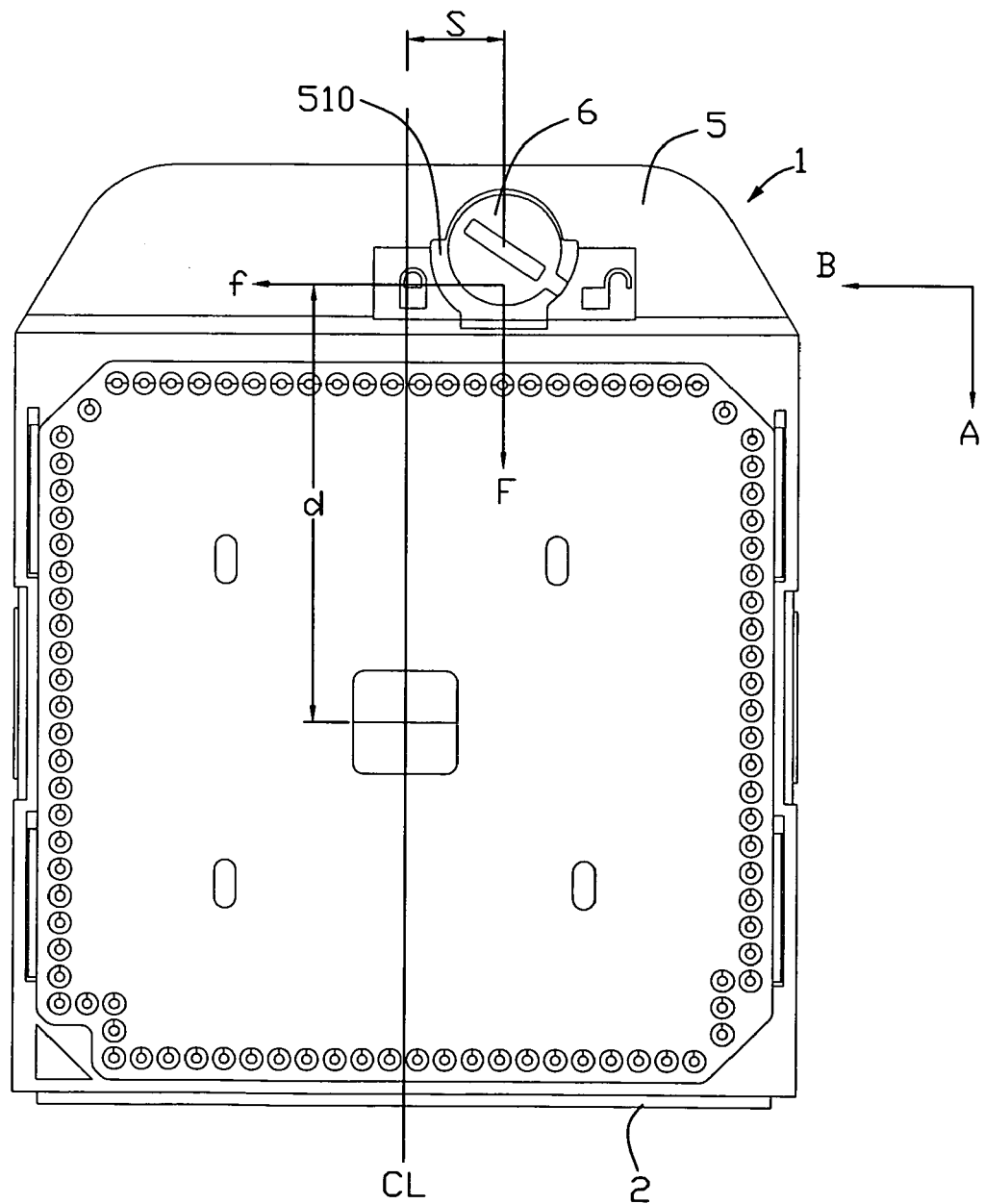
FIG. 4 is a top view of the IC socket shown in FIG. 1.
Figure 5:
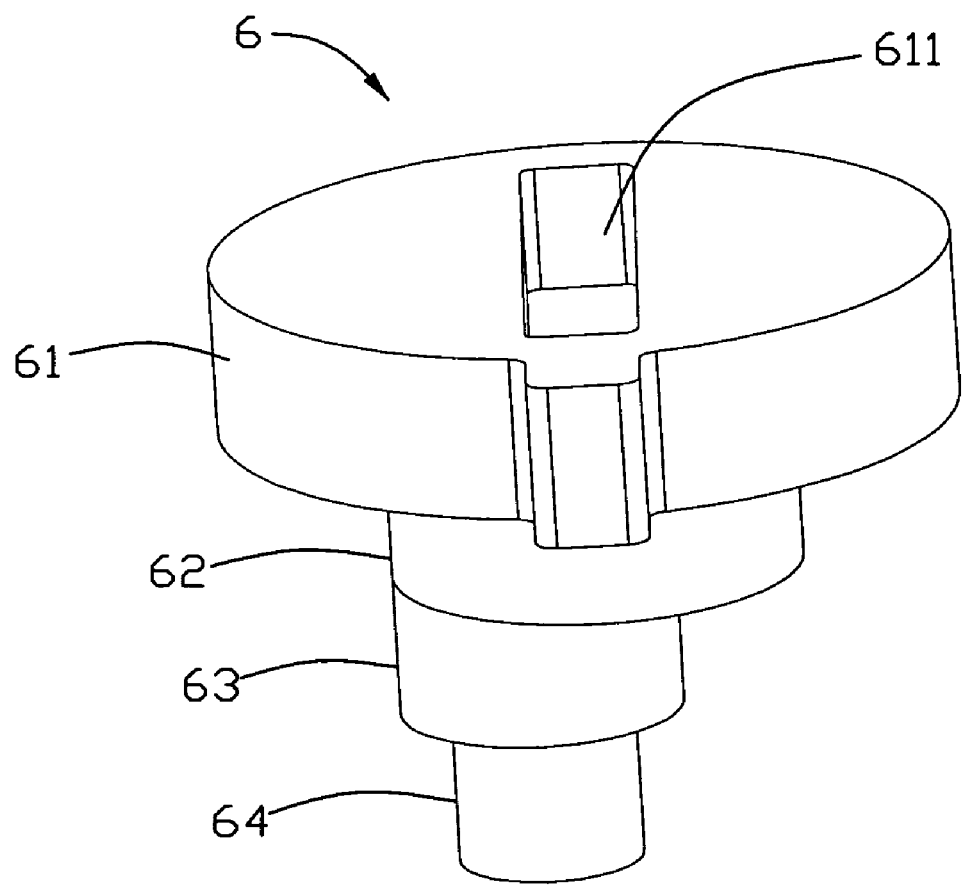
FIG. 5 is perspective view of a cam of the IC socket shown in FIG. 1.

Particularly referring to FIG. 4 and FIG. 5, the cam 6 is made of metal and is disposed at the cam-receiving section 51 for actuating the cover 5 to move with respect to the base 2 in a first direction A. The cam 6 consists of four columns stacked with other, of which the diameters decrease gradually, and taken from up-to-down view, they are respectively a head portion 61, a driving portion 62, a positioning portion 63 and a fixed end 64. The head portion 61 is received in the accommodating hole 510 of the cam-receiving section 51 and has a slot 611 for engaging with a tool as a screw driver (not shown) to rotate the cam 6. The driving portion 62 is received in the driving hole 40 of the strengthening member 4 so as to actuate the cover 5. The positioning portion 63 is located both in the ellipse positioning hole 30 of the stiffener 3 and the ellipse opening 211 of the base 2 to make sure the cam 6 is non-movable in the first direction A. The fixed end 64 extends out of the bottom of the base 2 to combine with a retaining member 8 so as to prevent the cam 6 from dropping away from the IC socket 1. The head portion 61 and the driving portion 62 share a same axis, and the positioning portion 63 and the fixed end 64 share a same axis. The two axises are offset from each other. The perimeters of the positioning portion 63 and the driving portion 62 are tangent.

The carrying section 50 of the cover 5 has a substantial rectangular shape and defines a central line CL extending along the first direction A and across the smooth surface 502. All of the accommodating hole 510 of the cam-receiving section 51, the driving hole 40 of the strengthening member 4, and the positioning hole 30 are offset from the central line CL. Due to offset configuration of the cam 6, the connecting line (not labeled) between the driving portion 62 and a substantial central portion of the carrying section 50 is deflecting a certain angle with the first direction A.

Particularly referring to FIG. 4, when the cover 5 is in an open position, the through holes 500 of the cover 5 are corresponding with the terminals 7, respectively. Assemble the IC package onto the carrying section 50 of the cover 5 with the pins passing through the through holes 500 and then arriving adjacent the terminals 7, respectively. When rotates the cam 6 clockwise, the cover 5 moves from the open position to a closed position along the first direction A. Because the positioning portion 63 and the driving portion 62 have different diameters and the axises thereof are not in a same line, and also because the positioning portion 63 is limited in positioning hole 30 and is not movable in the first direction A, the driving portion 62 engages the strengthening member 4 and thereby able to actuate the cover 5 to move along the first direction A. 'F' labeled in FIG. 4 is supposed to represent the pushing force exerted on the cover 5 by the driving portion 62, and 'f' to represent the friction force therebetween. Respectively, the pushing force 'F' is along the first direction A and the friction force 'f' is along a second direction B vertical to the first direction A. A torque is induced by the friction force 'f' and makes the cover 5 have a trend to rotate anticlockwise. Since the direction of the pushing force 'F' doesn't pass through the center of the cover 5 and thereby also induces another torque making the cover 5 have a trend to rotate clockwise. To a certain extent, the torques induced by the pushing force 'F' and the friction force 'f' offset with each other and thereby efficiently decrease the warpage of the cover 5. Since the positioning portion 62 is only able to move along with the cover 5 in the first direction A, the positioning portion 63 has to shift a proper distance along the second direction B. The ellipse positioning holes 30 just provides the space for movement of the positioning portion 63 in the second direction B.

When the cover 5 is in the closed position, the pins of the IC package are contacting with the terminals 7, respectively. During this process of shifting the cover 5 from the closed position to the open position, the corresponding pushing force and the friction force exerted on the cover 5 by the driving portion 62 are respectively reverse to those in the fore-described process, in which the cover 5 is shifted from the open position to the closed position. Obviously the torques induced by the pushing force and the friction force offset with each other again and thereby efficiently decrease the warpage of the cover 5.

A distance 's' is introduced to represent the distance between driving portion 62 of the cam 6 and the central line CL, and 'd' to represent the distance between the driving portion 62 and the center of the carrying section 50 along the direction A. Then the value of 's' depends on the pushing force 'F', the friction force 'f' as well as the distance 'd'. That is, the distance 's' is directly proportional to distance 'd' and the friction force T, and is inversely proportional to the pushing force 'F'.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket comprising:
   an insulative stationary base defining an ellipse opening;
   an insulative cover mounted upon the base and defining an accommodating hole, said cover being movable relative to the base in a front-to-back direction;
   a metallic strengthening member sandwiched between the base and the cover and defining a driving hole;
   said ellipse opening, said accommodating hole and said driving hole being essentially aligned vertically;
   a metallic cam defining a head portion rotatively snugly received in the accommodating hole, a driving portion snugly rotatively received in the driving hole, and a positioning portion received in the ellipse opening and movable therein along a transverse direction perpendicular to said front-to-back direction; wherein
   said assembled base and cover defines a center line extending along said front-to-back direction, and said cam is essentially located at an end of the assembled base and cover in said front-to-back direction, while being offset from a center line of the assembled base and cover in said transverse direction so that a torque effect derived from the movement of the cover in said front-to-back direction can be eliminated by another torque effect derived from movement of the positioning portion in said transverse direction.

2. An IC socket comprising:
   an insulative base with a plurality of contacts received therein;
   a cover mounted upon the base and defining a plurality of through holes corresponding to the contacts, the cover being movable along the base along a front-to-back direction and defining a center line along the front-to-back direction;
   a rotative cam embedded in one end of the assembled base and the cover, and located at an offset position from the center line in a left-to-right direction perpendicular to the front-to-back direction;
   wherein when the cam is rotated to actuate the cover to move along the base, a first force and a second force are respectively produced from the cam and exerted on the cover, the first force and the second force being substantially parallel to the front-to-back direction and the left-to-right direction, respectively, while neither of the first force nor the second force is fitly passing a center of gravity of the cover, thereby respectively generating a first torque and a second torque which are against each other, to a certain extent, so that the warpage of the cover is effectively reduced.

3. The IC Socket as claimed in claim 2, wherein the cover has a strengthening member defining a driving hole therein, and said cam is inserted in the driving hole and directly engaged with the same to indirectly drive the cover.

4. The IC Socket as claimed in claim 2, wherein the base is provided with a stiffener having an ellipse positioning hole, the ellipse positioning hole engaging a positioning portion of the cam and allowing the positioning portion to move therein along the left-to-right direction.

* * * * *